(12) United States Patent
Marsh

(10) Patent No.: US 6,387,802 B1
(45) Date of Patent: May 14, 2002

(54) NUCLEATION AND DEPOSITION OF PT FILMS USING ULTRAVIOLET IRRADIATION

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/594,339

(22) Filed: Jun. 15, 2000

Related U.S. Application Data

(62) Division of application No. 09/221,861, filed on Dec. 29, 1998.

(51) Int. Cl.$^7$ ................................................. H01L 21/44
(52) U.S. Cl. ....................................... 438/680; 438/681
(58) Field of Search .................................. 438/681, 686, 438/778, 788, 798, 260, 259, 580, 650, 680, 575, 3, 240, 253, 396

(56) References Cited

U.S. PATENT DOCUMENTS

| | | | |
|---|---|---|---|
| 4,971,853 A | 11/1990 | Chaiken et al. | |
| 5,130,172 A | 7/1992 | Hicks et al. | |
| 5,139,818 A | 8/1992 | Mance | |
| 5,214,302 A | 5/1993 | Uchida et al. | |
| 5,372,849 A | 12/1994 | McCormick et al. | |
| 5,696,384 A | 12/1997 | Ogi et al. | |
| 5,741,577 A | 4/1998 | Yamamoto et al. | |
| 5,741,721 A | * 4/1998 | Stevens | 438/681 |
| 5,751,019 A | 5/1998 | Fair | |
| 5,828,129 A | 10/1998 | Roh | |
| 5,990,559 A | * 11/1999 | Marsh | 257/768 |
| 6,110,531 A | * 8/2000 | Paz de araujo et al. | 438/778 |
| 6,114,199 A | * 9/2000 | Isobe et al. | 438/240 |
| 6,162,712 A | * 12/2000 | Baum et al. | 438/580 |
| 6,204,172 B1 | * 3/2001 | Marsh | 438/653 |
| 6,204,178 B1 | * 3/2001 | Marsh | 438/686 |

* cited by examiner

Primary Examiner—David Nelms
Assistant Examiner—David Nhu
(74) Attorney, Agent, or Firm—Dickstein Shapiro Morin & Oshinsky LLP

(57) ABSTRACT

A method of depositing a platinum based metal film by CVD deposition includes bubbling a non-reactive gas through an organic platinum based metal precursor to facilitate transport of precursor vapor to the chamber. The platinum based film is deposited onto a non-silicon bearing substrate in a CVD deposition chamber in the presence of ultraviolet light at a predetermined temperature and under a predetermined pressure. The film is then annealed in an oxygen atmosphere at a sufficiently low temperature to avoid oxidation of substrate. The resulting film is free of silicide and consistently smooth and has good step coverage.

15 Claims, 11 Drawing Sheets

NUCLEATION AND DEPOSITION OF PT FILMS USING ULTRAVIOLET IRRADIATION

This application is a divisional of application, Ser. No. 09/221,861 filed Dec. 29, 1998, the entirety of which is incorporated herein by reference.

FIELD OF THE INVENTION

The invention relates generally to the chemical vapor deposition (CVD) of platinum group metals on an integrated circuit structure as a continuous film and with good step coverage. The invention also relates to integrated circuits having a platinum group metal layer, used, for example, as the lower electrode in a capacitor.

DISCUSSION OF RELATED ART

Because of their high corrosion resistance, microelectronic devices having platinum group metals are desired in applications where great reliability is desired and also where a corrosive atmosphere may be present. A process is needed to deposit a platinum group metal having good step coverage and where the platinum film can be patterned to avoid an extra etching step.

Conventional methods of depositing platinum films suffer drawbacks in that these methods are unable to consistently create a continuous uniformly thin platinum film that additionally has good step coverage. These conventional prior methods include vacuum deposition methods, sputtering methods and even chemical vapor deposition. Even in the conventional chemical vapor deposition methods it is difficult to create a continuous uniform platinum film with good step coverage.

This is likely due to the fact that when conventional platinum precursors are used in the conventional chemical vapor deposition methods, it is difficult to control the nucleation rate of the platinum films. At the outset of the platinum deposition process, the nucleation rate of the platinum film onto the surface of the substrate is very slow; however, once nucleation does begin the deposition rate of the platinum film onto the surface increases significantly. In fact, it is difficult to control or even slow the rate of deposition once the conventional methods begin depositing platinum onto the surface of the substrate. In the conventional methods therefore, it is difficult to begin the deposition process and even more difficult to thereafter control the deposition rate so as to arrive at a uniform thin platinum film having good step coverage.

One example of the problem with using conventional methods to deposit platinum is discussed with reference to FIG. 1. Here it is desired to deposit a platinum layer 210 onto the side surfaces of a deep container capacitor 230. The platinum layer 210 is formed by CVD deposition using a conventional platinum precursor. As the process begins, a platinum film 210 forms on the upper layer 220 of the capacitor 200. Since it is difficult to control the deposition rate of the platinum layer 210, the platinum layer 210 quickly forms a thick layer on the upper layer 220 of the capacitor 230 before it can coat the inside walls of the capacitor 230. That is, the quickly formed platinum layer 210 pinches together over the opening 230 in the capacitor 200 and very little platinum is able to form on the inside walls 240 or the bottom 250 of the capacitor 230. Thus, an inconsistent platinum film is formed on the inside walls 240 and the bottom 250 of the capacitor 230 without good step coverage.

One prior solution to increase the smoothness of the film deposited was to increase the temperature at which the metal is deposited. When the temperature at which the conventional CVD process operates is increased, the growth rate of the platinum also increases. While increasing the temperature does result in a smoother film, the increased temperature also increases the deposition rate and the pinch-off effect, as previously described. If the temperature of the CVD process is decreased, the growth rate of the platinum also decreases, resulting in better step coverage; however, when the temperature of the CVD process is decreased the carbon content of the deposited film increases, resulting in poor film quality.

To reduce the carbon content of the film, the conventional methods added oxygen during the CVD process. The oxygen removed some of the carbon from the platinum film; however, the oxygen also increased the deposition rate of the platinum resulting in a film similar to the high temperature deposited film described above. Thus, with conventional methods it is difficult to achieve both good step coverage and a smooth continuous film, which is especially important in the manufacture of an integrated circuit. Additionally, conventional methods often require that the platinum film be etched to remove the deposited platinum film where it is not desired.

SUMMARY OF THE INVENTION

The present invention overcomes the drawbacks of patterning platinum group metals by conventional methods and provides a CVD method which produces a smooth, uniform, continuous film of a platinum group metal which also has good step coverage. The present invention also allows the platinum film to be patterned onto a substrate. The invention includes depositing the platinum metal group in conjunction with ultraviolet light using a CVD process followed by low temperature annealing in order to remove carbon in the platinum group metal.

The invention relates to the formation of a continuous film layer of platinum group metal by CVD. The invention may find many uses where a thin uniform layer of platinum group metal is needed. For example, the invention is useful in the computer microchip industry, such as for the undercoating electrode of a dielectric memory in a semiconductor device. The invention relates to a chemical vapor deposition method to deposit the platinum group metal onto a surface. The starting material for preparation of the platinum group metal film may be any organic platinum group metal precursor suitable for deposition of the platinum group metal.

The invention provides a process for depositing a platinum metal on a substrate which includes the steps of flowing a gas having adsorbed therein a predetermined thickness of platinum metal precursor over the substrate at a selected temperature and pressure in the presence of ultraviolet light or flowing the platinum metal precursor over a substrate and then irradiating the substrate with ultraviolet light. The selected operating temperature is a temperature at which the platinum group metal deposits on the substrate, but less than a temperature at which the platinum group metal fails to smoothly deposit on the substrate. The pressure at which the process operates is a pressure at which the platinum group metal will deposit on the substrate in a continuous film while maintaining good step coverage. The substrate is a non-silicon containing film. In order to avoid silicidation of platinum during anneal, the substrate is then subjected to a low temperature anneal in the presence of oxygen at a temperature low enough as to not oxidize the substrate. By carrying out this process, a platinum group metal film may be deposited on the exposed portions of the substrate in a uniform film.

The above and other advantages and features of the invention will be more clearly understood from the following detailed description which is provided in connection with the accompanying drawings.

DETAILED DESCRIPTION OF THE PREFERRED EMBODIMENTS

The terms wafer or substrate used in the description include any semiconductor-based structure in which to form the contact electrode structure of this invention, provided the substrate is coated with a barrier layer as described in more detail below. Wafer and substrate are to be understood as including silicon-on insulator (SOI) technology, silicon-on-sapphire (SOS) technology, doped and undoped semiconductors, epitaxial layers of silicon supported by a base semiconductor foundation, and other semiconductor structures. The terms wafer and substrate used in the description also includes any etchable non-silicon structure as described in more detail below. Furthermore, when reference is made to a wafer or substrate in the following description, previous process steps may have been utilized to form regions/junctions in the base semiconductor structure or foundation.

An exemplary apparatus used in the process for depositing a platinum group metal according to one embodiment of the present invention is described below. It is to be understood, however, that this apparatus is only one example of many possible different apparatuses that may be used to deposit the platinum group metal by chemical vapor deposition according to the invention. The invention is not intended to be limited by the particular apparatus described below.

Figure 1:
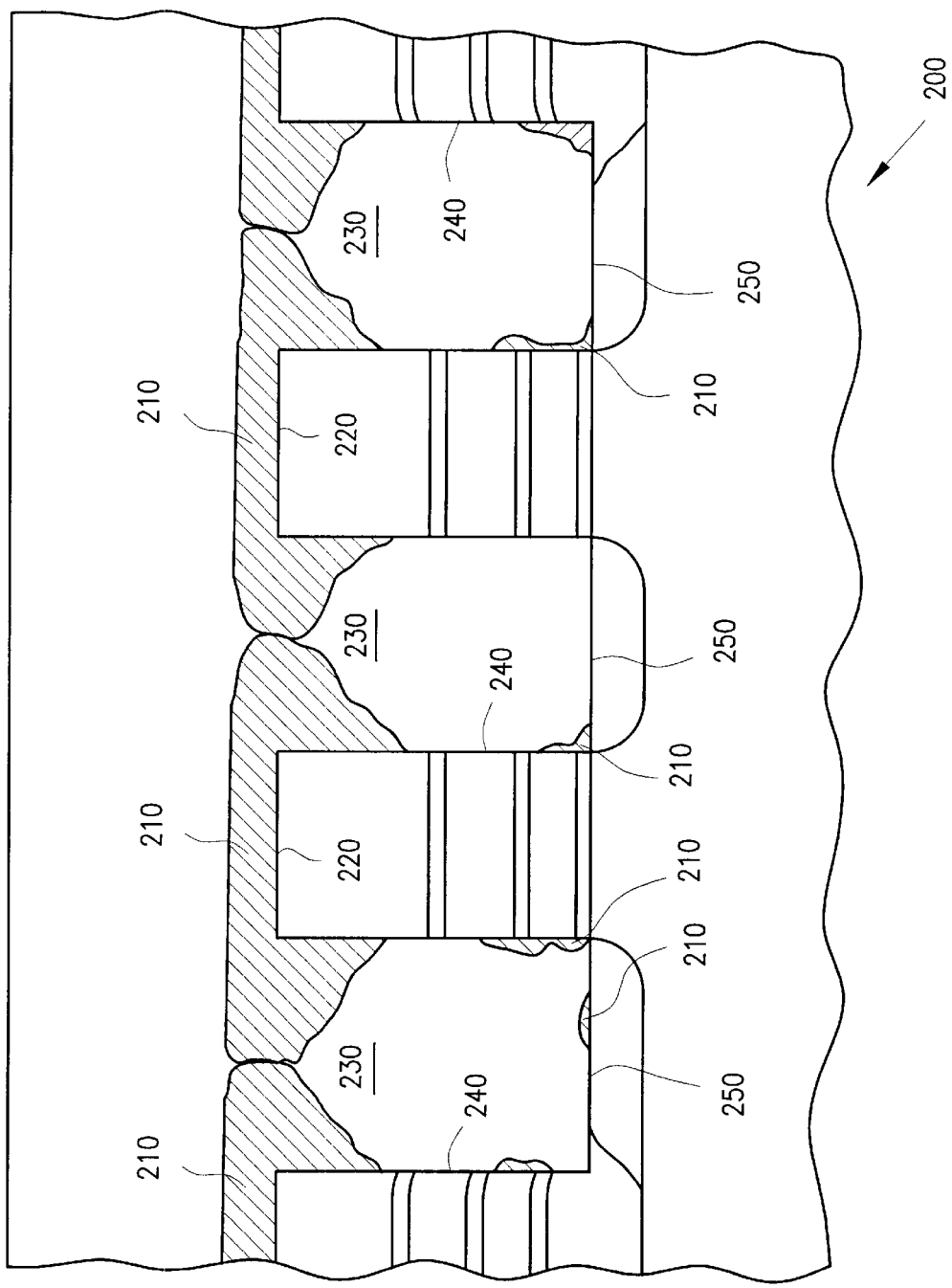
FIG. 1 is a diagrammatic cross-sectional view of a portion of a semiconductor wafer with a platinum layer deposited according to the conventional methods.
Figure 2:
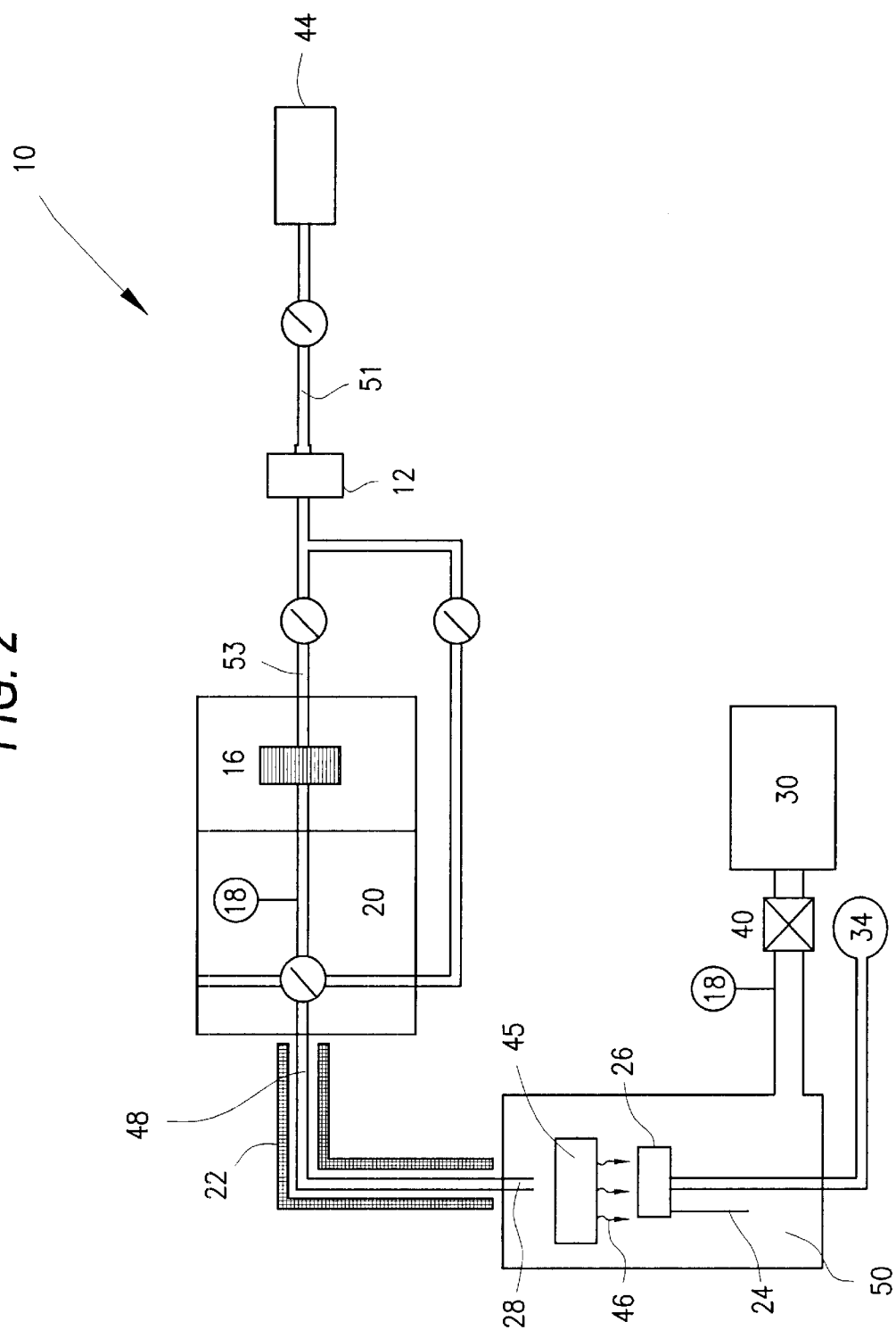
FIG. 2 is a schematic view of an apparatus which may be used in the present invention.

Referring now to FIG. 2, the apparatus is used to carry out the invention generally indicated by reference number 10. The apparatus 10 includes a flow gas source 44. The flow gas source 44 is bubbled through the organic platinum group metal precursor for deposition in the CVD deposition chamber 50. The flow gas from source 44 flows through conduit 51 past flow controller 12 and into the vessel 20. The flow gas may be any noble gas or gas which is non-reactive with the precursor that is capable of carrying the organic platinum group metal precursor into the deposition chamber.

The flow gas flows through conduit 53 past the source bubbler 16 where the flow gas serves to facilitate the transport of the organic platinum group metal precursor into the CVD deposition chamber 50 through conduit 48. The gas flowing though conduit 48 is heated to a predetermined temperature by heater 22 before entering the CVD deposition chamber 50. The gas flows through nozzle 28 into the CVD deposition chamber 50. The CVD deposition chamber is also heated to a predetermined reaction temperature by heat source 34.

The temperature in the CVD deposition chamber 50 is measured by a thermocouple 24 which is in contact with the substrate 26. Pressure in the CVD deposition chamber 50 is controlled by a pump 30 and pump valve 40. The pressure in the CVD deposition chamber can be determined by the pressure gauge 18. A precursor film is then deposited on the substrate 26 from the gas. The substrate 26 is then irradiated by ultraviolet light 46 from ultraviolet light source 45. Once the substrate 26 has been in the CVD deposition chamber 50 subject to the ultraviolet light 46 for a predetermined period of time, the substrate 26 is removed from the CVD deposition chamber 50. The substrate 26 is then annealed in an oxygen atmosphere to remove carbon from the platinum film as described in more detail below.

The platinum group metals which can be deposited onto the surface of a substrate according to the present invention include Ru, Rh, Pd, Os, Ir Ag, Au or Pt or mixture thereof. These platinum group metals are deposited by bubbling an organic platinum group metal precursor containing the desired platinum group metal into a non-reactive flow gas. Preferably the platinum group metal is platinum.

The organic platinum group metal precursor may be any suitable organic compound which will allow the metal to deposit from the gas phase onto a substrate under CVD conditions. The organic precursor are may be, for example, cyclopentadienyl trimethylplatinum (IV), $(C_5H_5)Pt(CH_3)_3$, (hereinafter abbreviated as "(Cp)PtTM") or a derivative thereof such as, methylcyclopentadienyl trimethylplatinum $CH_3(C_5H_5)Pt(CH_3)_3$ (hereinafter abbreviated as "Me(Cp)PtTM," platinum beta-diketonates, platinum bis-(acetylacetonate), dimethyl platinum cyclopentadienide or dialkyl platinum dienes. Preferably the organic platinum precursors are (Cp)PtTM or Me(Cp)PtTM. Suitable organic precursors for the Ru, Rh, Pd, Os Ag, Au and Ir metals may also be used such as $(Cp)Rh(CO)_2$, $Me(Cp)Rh(CO)_2$, or $(Cp)Ir(CO)_2$.

The carrier gas into which the organic platinum group precursor is bubbled may be any suitable gas, preferably a non-reactive gas. The purpose of the carrier gas is to transport the organic platinum group precursor to the CVD deposition chamber in gaseous form so that the metal can be deposited onto the surface of a substrate in the chamber. Suitable non-reactive gases include helium, nitrogen, neon, argon, krypton, and xenon. Preferably the carrier gas is selected from helium, argon and nitrogen, most preferably helium. The carrier gas may also comprise mixtures of the non-reactive gases.

The non-reactive gas, together with the organic platinum group precursor dissolved therein, is fed into the CVD deposition chamber at a rate of about 5 to about 5000 standard cubic centimeters per minute ("sccm"), more preferably from about 100 to about 2000 sccm, most preferably about 1000 sccm. The flow rate of the non-reactive gas to be fed to the CVD deposition chamber is determined based on platinum group metal to be deposited as well as the substrate on which the metal is to be deposited. The non-reactive gas flow rate may also vary depending upon the temperature and pressure at which the deposition takes place, or the bubbler temperature.

In the first method according to the present invention, a substrate is placed in a CVD deposition chamber and the flow gas is then fed to the chamber. Once the substrate has been coated by the organic precursor, the organic precursor is decomposed by irradiation with ultraviolet light to form a platinum group metal film over the substrate. The substrate is then annealed in an oxygen atmosphere as described below. Additionally, the present invention includes flowing an organic precursor over a substrate in a CVD deposition chamber while the substrate is being rotated to coat the entire substrate with the precursor. The substrate is then irradiated with ultraviolet light to cause decomposition of the organic precursor to form a platinum group metal film. The substrate is then annealed in an oxygen atmosphere as described below. A second method of the present invention includes flowing an organic precursor over a substrate in a CVD deposition chamber while the substrate is being irradiated with ultraviolet light, thereby decomposing the organic precursor to form a platinum group metal film. The substrate is then annealed in an oxygen atmosphere as described below.

The temperature at which the CVD deposition process is operated can range from about −100° C. to about 200° C., preferably from about 0° C. to about 150° C., most preferably about 25° C. The pressure at which the CVD deposition process is operated can range from about 0.1 to about 1000 Torr. Preferably the pressure is from about 1 Torr to about 10 Torr. The temperature and pressure of the CVD deposition process depends upon the platinum group metal which is to be deposited as well as the substrate on which the metal is to be deposited as well as the other reaction parameters such as reaction time or the flow rate of the materials into the reaction vessel.

The CVD deposition of the invention is useful for depositing any of the platinum group metals onto the surface of any substrate which will not lead to silicidation of platinum. For example, a platinum group metal may be deposited according to the invention onto TiN, Ti, Ta, TaN, W, WN, Co, Ru, oxides any etchable non-Si substrate.

The method of the present invention is preferably used to deposit a platinum metal film on a barrier layer formed over a silicon substrate. The barrier layer may be TiN, TaN, WN, TiAlN or the like. Because the operation temperature of the CVD deposition and the annealing step are at a low temperature, it is possible to deposit the platinum metal film over a barrier layer such as TiN without oxidizing the underlying barrier layer during the annealing step.

The method for CVD deposition a platinum group metal according to the present invention may deposit a continuous film of the metal having good step coverage to a thickness of about 20 to about 2000 Angstroms, preferably about 50 to about 400 Angstroms. In order to deposit the platinum group metal, the substrate should remain in the CVD deposition chamber under the ultraviolet light for a time ranging from about 1 to about 6000 seconds, preferably from about 15 to about 120 seconds, most preferably about 30 seconds. The time for the substrate to remain in CVD deposition chamber in accordance with the present invention will be determined based on the platinum group metal which is to be deposited as well as the substrate on which the metal is to be deposited and the intensity of the ultraviolet light source. The ultraviolet light source preferably has a wavelength of less than 350 nm, more preferably about 260 nm in order to effectively deposit the platinum film over the substrate. The timing of the reaction is also dependent upon the other reaction parameters, such as the flow rate of the saturated organic precursor flow gas, the temperature and the pressure at which reaction takes place.

After the substrate is removed from the CVD chamber, the platinum metal film contains carbon from presence of the organic precursor. The substrate must then be annealed in an oxygen environment at low temperature to remove the excess carbon from the platinum metal film. Preferably the low temperature annealing step is performed at a temperature of from about 150° C. to about 400° C., preferably from about 200° C. to about 300° C., most preferably about 250° C.

As set forth above, the ultraviolet irradiation causes photo-decomposition of the organic platinum metal precursor. This photo-decomposition forms a platinum film with a high carbon content. The oxygen annealing step removes the carbon from the platinum film leaving a clean metallic film. The low temperature annealing step of the present invention allows the deposition of a barrier layer such as TiN, TaN, WN or TiAlN over the silicon substrate with subsequent deposition of a platinum metal layer over the barrier layer. The low temperature annealing step of the present invention removes the carbon from the metal film, but does not oxidize the barrier layer, thereby eliminating metal silicide formation.

A second embodiment of the present invention is similar to the first embodiment of the present invention; however, instead of irradiating the sample after waiting for the organic precursor to flow over the substrate, the substrate is placed in the CVD deposition chamber and while the organic precursor flows into the CVD deposition chamber the substrate is concurrently irradiated with ultraviolet light from the ultraviolet light source. The temperature, pressure and other parameters are within the same ranges for the second embodiment of the invention as described above with relation to the first embodiment of the present invention.

Figure 3:
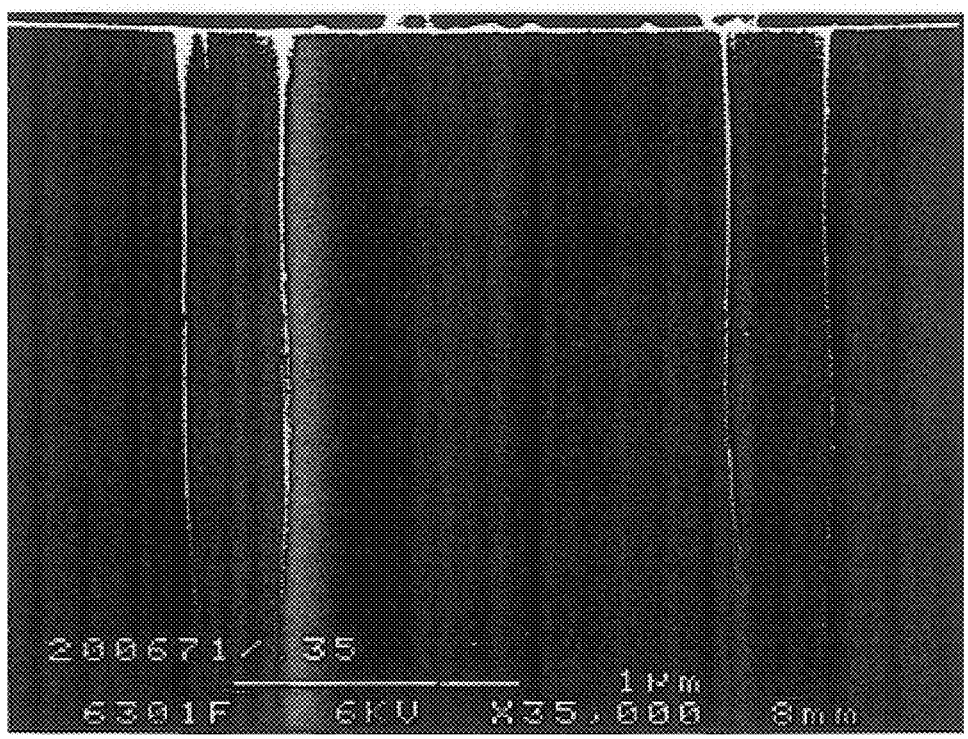
FIG. 3 is a microscopic photograph of a platinum film deposited on a substrate according to a method of the present invention.

The invention provides a method of deposition of platinum group metals in the presence of ultraviolet light followed by a low temperature anneal in an oxygen atmosphere. The method creates a platinum group metal film that is both consistently smooth and has good step coverage as shown by the uniform platinum film along the sidewalls of the trench shown in FIG. 3.

The combination of good step coverage and a smooth continuous film is useful for deposition in integrated circuits, especially for the top and bottom electrode in a capacitor in a memory cell. In integrated circuit manufacturing, there is continuous pressure to decrease the size of individual cells and increase memory cell density to allow more memory to.be squeezed onto a single memory chip. However, it is necessary to maintain a sufficiently high storage capacitance to maintain a charge at the refresh rates currently in use even as cell size continues to shrink. This requirement has led manufacturers to turn to three dimensional capacitor designs, including trench and stacked capacitors. A particular type of stacked capacitor is a container capacitor. In a container capacitor, it is important that the material forming the electrode layers of the capacitor, specifically the lower electrode, be consistently deposited with good step coverage so that the memory circuit can take advantage of the capacitance of the deep container walls. The present invention provides a method for forming films of platinum based metals that can meet these requirements.

The invention is further explained with reference to the following example. This invention is not intended to be limited by the particular example described below.

EXAMPLE

Figure 4:
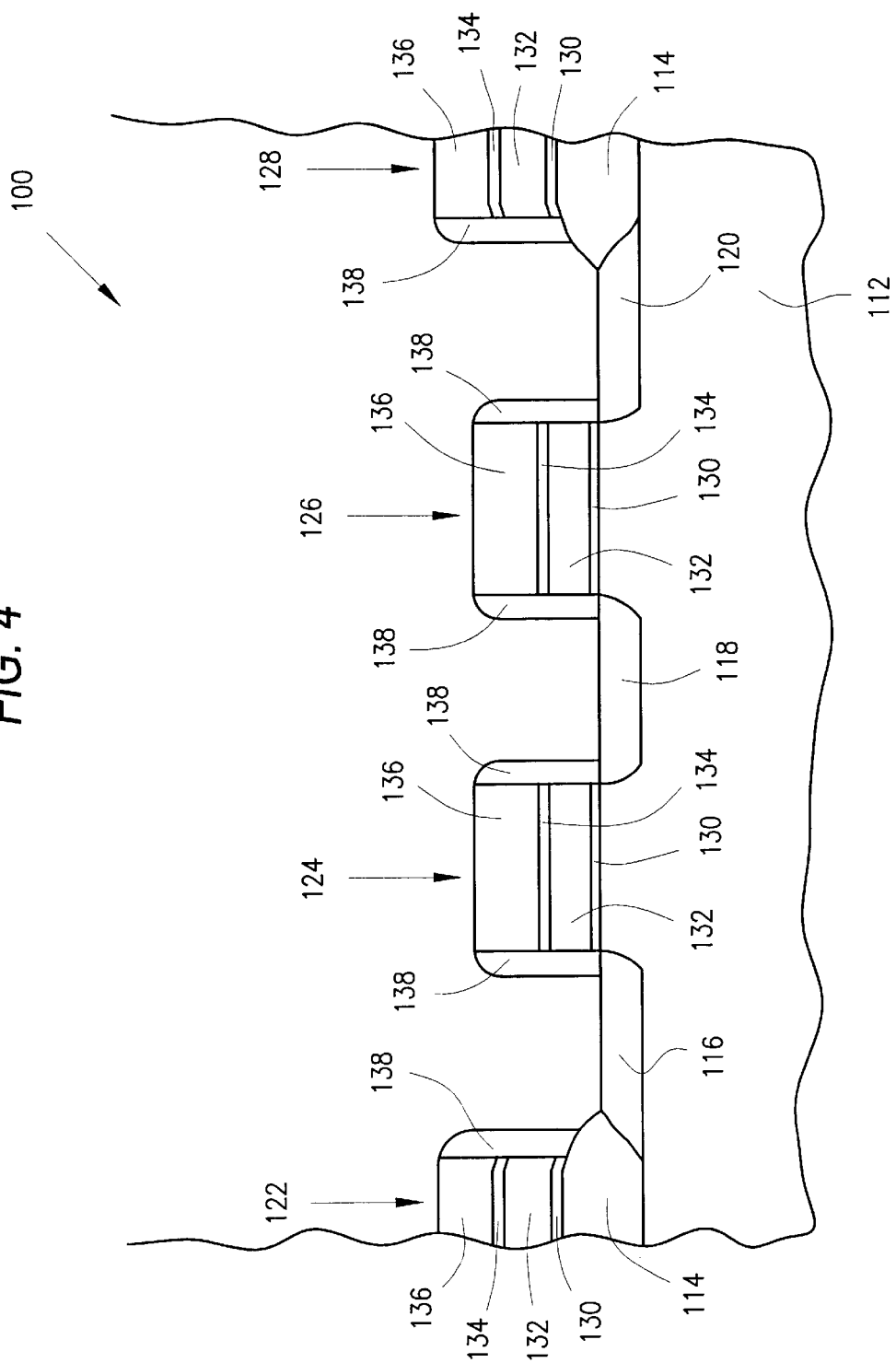
FIG. 4 is a diagrammatic cross-sectional view of a portion of a semiconductor wafer at an early processing step according to one embodiment of the present invention.

In this example a lower electrode for a capacitor in a memory cell is formed of platinum according to the present invention. Referring to FIG. 4, a semiconductor wafer fragment at an early processing step is indicated generally by reference numeral 100. The semiconductor wafer 100 is comprised of a bulk silicon substrate 112, which may be doped to a predetermined conductivity type, and with field isolation oxide regions 114 and active areas 116, 118, 120 formed therein. Word lines 122, 124, 126, 128 have been constructed on the wafer 100 in a conventional manner. Each word line consists of a lower gate oxide 130, a lower polysilicon layer 132, a higher conductivity silicide layer 134 and an insulating silicon nitride cap 136. Each word line has also been provided with sidewall insulating spacers 138, which are also composed of silicon nitride.

Figure 5:
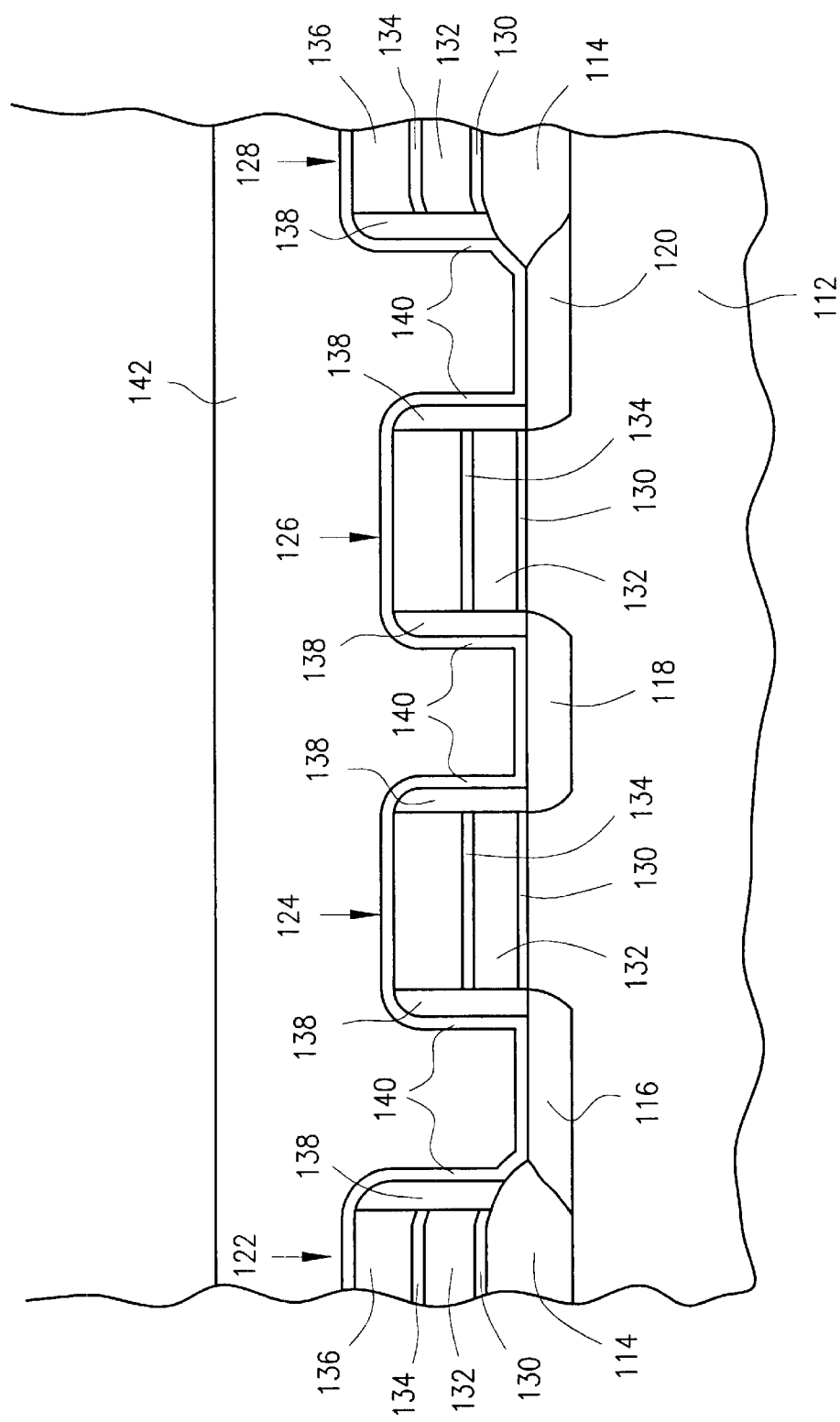
FIG. 5 is a diagrammatic cross-sectional view of a portion of a semiconductor wafer at a processing step subsequent to that shown in FIG. 4.

Referring now to FIG. 5, a thin layer 140 of nitride or TEOS (tetraethyl orthosilicate) is then provided atop the wafer 100. Next a layer of insulating material 142 is deposited. The insulating material preferably consists of BPSG. The insulating layer 142 is subsequently planarized by chemical-mechanical polishing (CMP).

Figure 6:
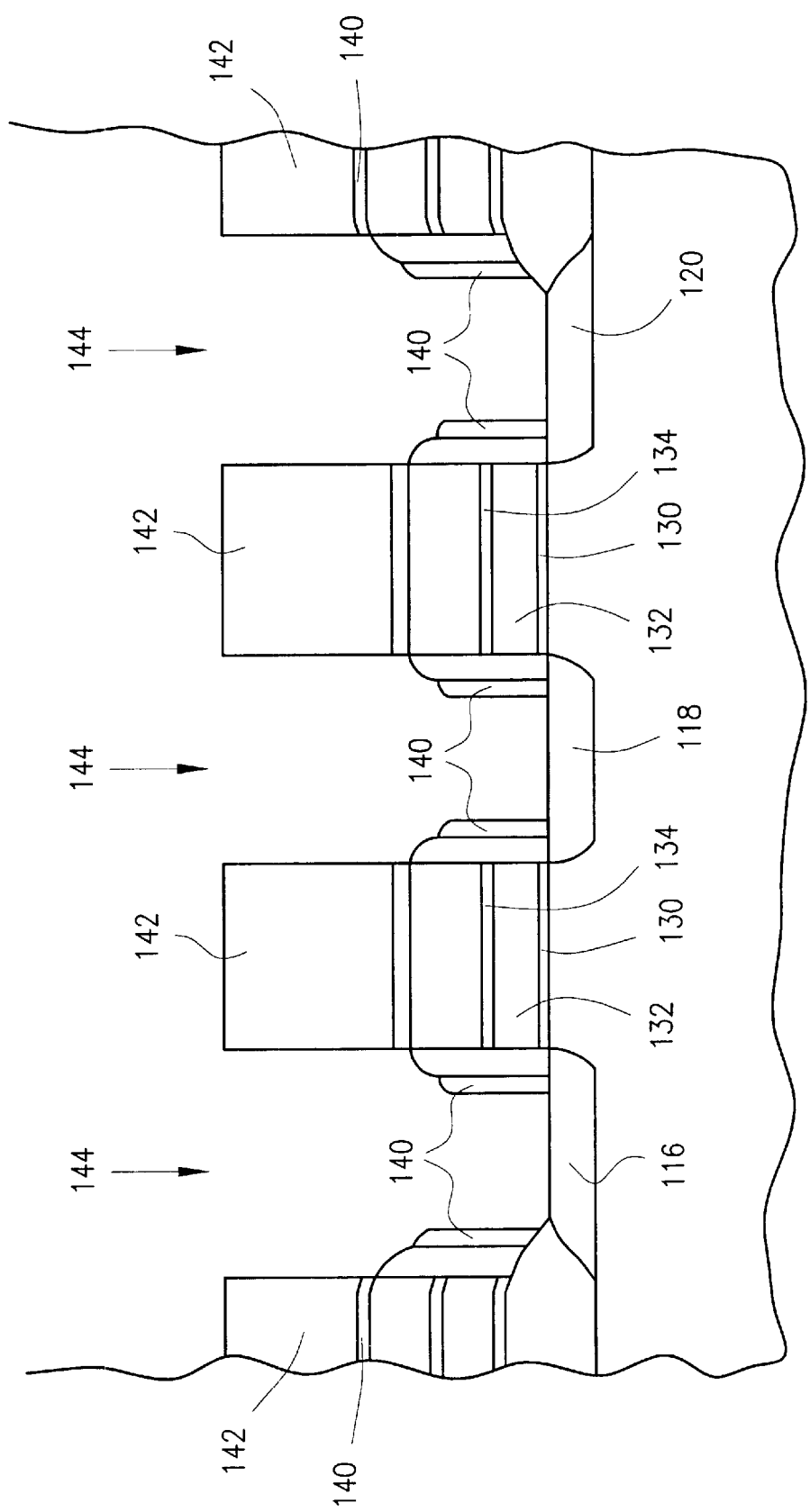
FIG. 6 is a diagrammatic cross-sectional view of a portion of a semiconductor wafer at a processing step subsequent to that shown in FIG. 5.

Referring now to FIG. 6, plug openings 144 have been formed through the insulating layer 142. The plug openings. 144 are formed through the insulating layer 142 by photomasking and dry chemical etching the BPSG relative to the thin nitride layer 140. A portion of the thin nitride layer 140 is also removed by the etching process to arrive at the substrate as shown in FIG. 6.

Figure 7:
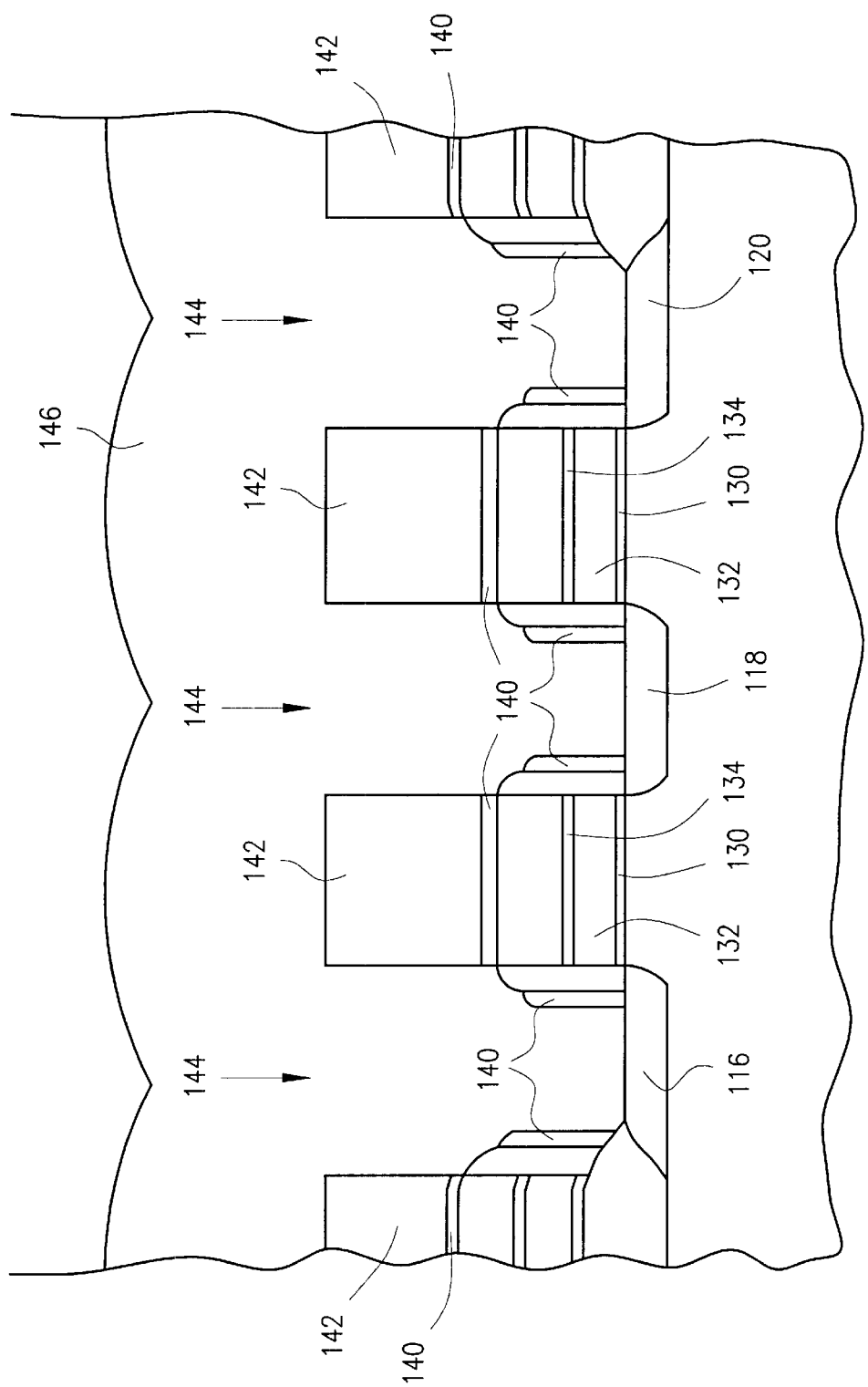
FIG. 7 is a diagrammatic cross-sectional view of a portion of a semiconductor wafer at a processing step subsequent to that shown in FIG. 6.
Figure 8:
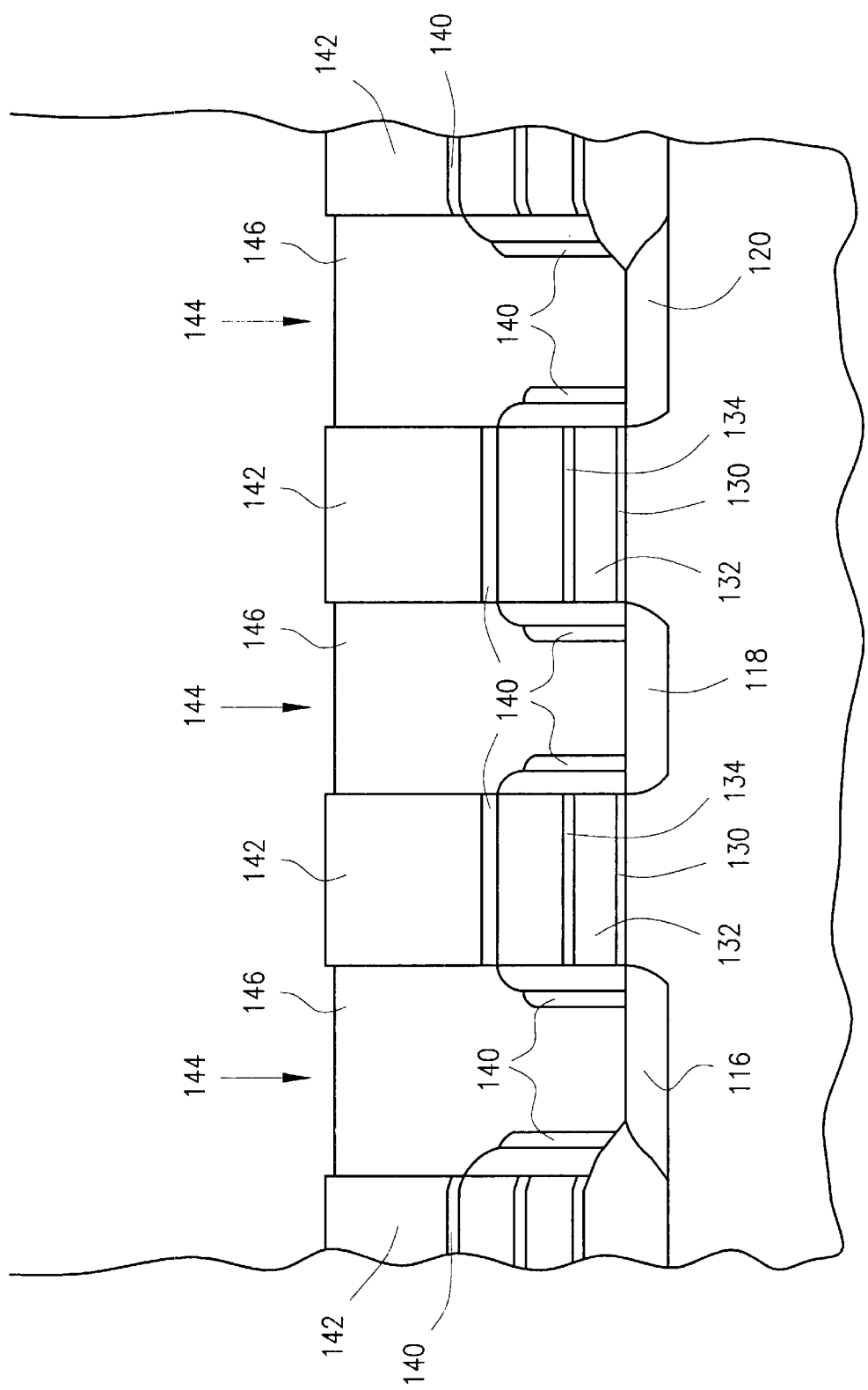
FIG. 8 is a diagrammatic cross-sectional view of a portion of a semiconductor wafer at a processing step subsequent to that shown in FIG. 7.

Referring now to FIG. 7, a conductive plug layer 146 is formed. An example of the material used to form conductive plug layer 146 is in situ arsenic or phosphorous doped polysilicon. Referring now to FIG. 8, the conductive plug layer 146 is dry etched to a point just below the upper surface of the BPSG layer 142 such that the remaining material of the conductive plug layer 146 forms electrically isolated plugs 146 over the active areas 116, 118, 120.

Figure 9:
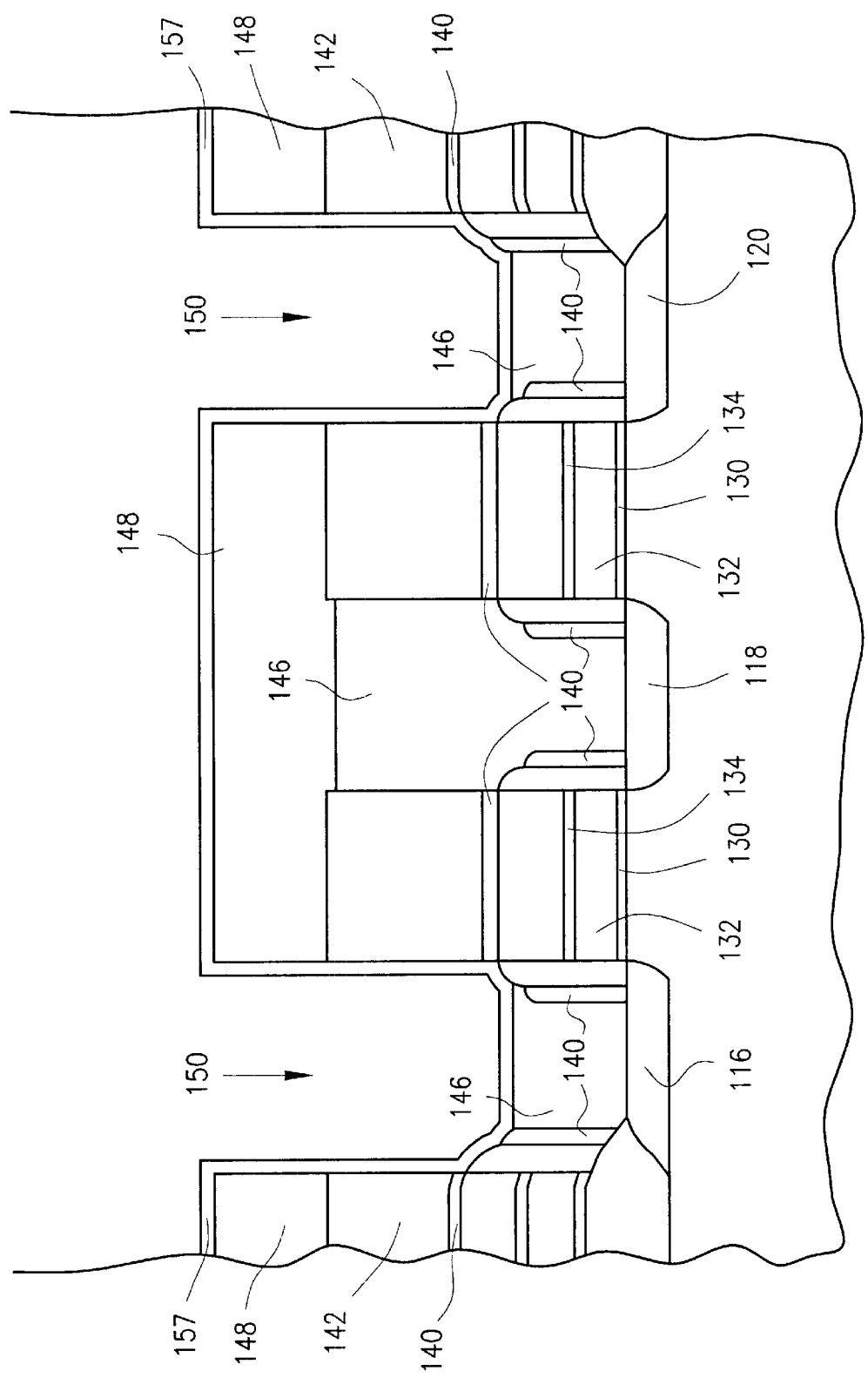
FIG. 9 is a diagrammatic cross-sectional view of a portion of a semiconductor wafer at a processing step subsequent to that shown in FIG. 8.

Referring now to FIG. 9. An additional layer 148 of BPSG was deposited on the structure and capacitor openings 150 are then formed in the BPSG layer 148 by photomasking and dry chemical etching. The height of the plugs, as defined by the conductive plug layer 146 over the non-bit line active areas 116, 120 is also reduced by this step. A thin barrier layer 157 deposited. Preferably the thin barrier layer 157 is formed of TiN.

Figure 10:
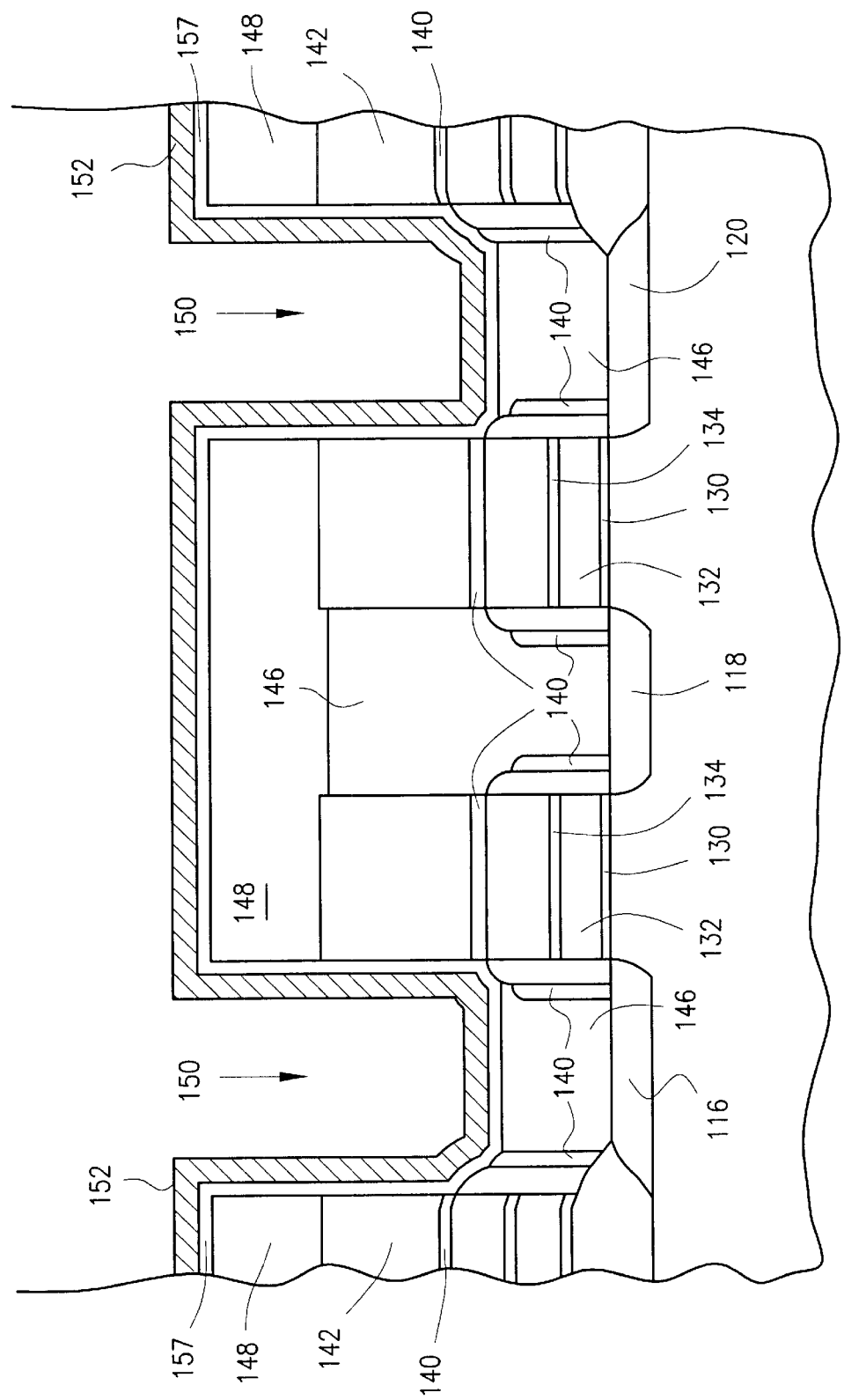
FIG. 10 is a diagrammatic cross-sectional view of a portion of a semiconductor wafer at a processing step subsequent to that shown in FIG. 9 showing a platinum lower electrode.

Referring now to FIG. 10, a platinum layer 152 that will form the lower electrode of the capacitor is deposited. The platinum layer 152 is deposited by the methods described above. The platinum is deposited by an organic platinum precursor of Me(Cp)PtTM over the substrate and then irradiating the material with ultraviolet light to decompose the organic precursor to form a platinum layer 152. The platinum layer 152 may be formed by depositing an organic precursor onto the substrate then irradiating the substrate with ultraviolet light or the platinum layer 152 may be formed by simultaneously irradiating the organic precursor onto the substrate in the presence of ultraviolet light as described above. The substrate is then annealed at low temperature in the presence of oxygen to remove the carbon from the platinum layer 152 as described above. The process formed a continuous platinum layer 152 with good step coverage.

Since the platinum layer 152 is resistant to oxidation it provides an excellent surface for the deposition of the high dielectric constant material. In addition, the platinum layer 152 protects the top surface of the polysilicon plug 146 from strong oxidizing conditions during further deposition. Therefore platinum is used as the lower portion of the first electrode since it will not oxidize during subsequent deposition, etches or anneals. Further, since the barrier layer 157 was deposited prior to the platinum layer 152 and the anneal was performed at low temperature as described herein, no platinum silicide formed during the formation of the platinum layer 152.

Figure 11:
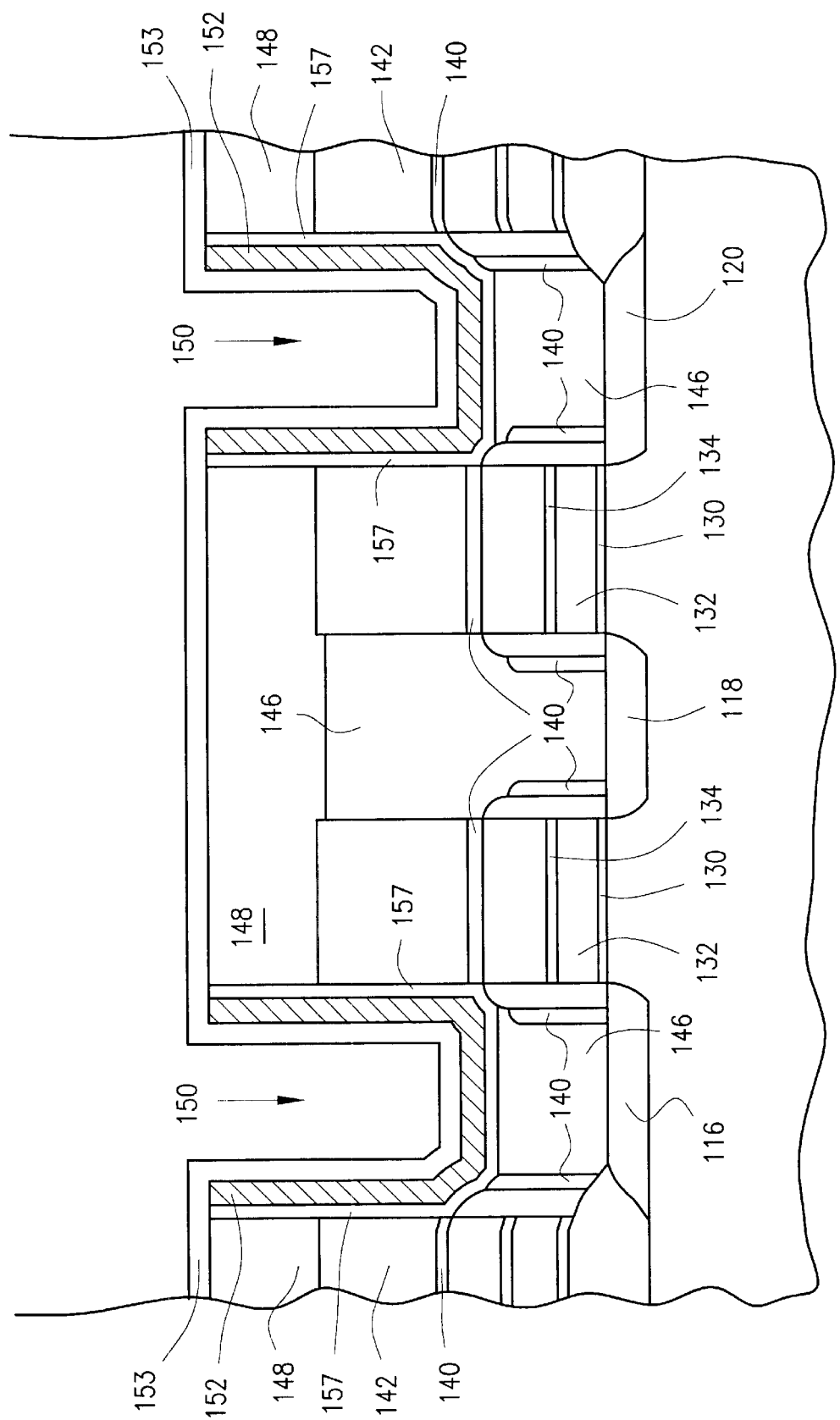
FIG. 11 is a diagrammatic cross-sectional view of a portion of a semiconductor wafer at a processing step subsequent to that shown in FIG. 10.

Referring to FIG. 11, the upper layer of the electrode 152 is removed from the top surface of the BPSG layer 148. Preferably this is done by CMP. A dielectric layer 153 is then deposited over the platinum layer 152. The dielectric layer 153 may also be formed of any dielectric material, such as tantalum pentoxide ($Ta_2O_5$). A second electrode may then be deposited over the dielectric layer 153 to complete the capacitor cell as is known in the art. Any suitable electrode material may be used, including but not limited to a platinum group metal deposited according to the present invention.

It should again be noted that although the invention has been described with specific reference to DRAM memory circuits and container capacitors, the invention has broader applicability and may be used in any integrated circuit requiring capacitors. Similarly, the process described above is but one method of many that could be used. Accordingly, the above description and accompanying drawings are only illustrative of preferred embodiments which can achieve the features and advantages of the present invention. It is not intended that the invention be limited to the embodiments shown and described in detail herein. The invention is only limited by the spirit and scope of the following claims.

What is claimed as new and desired to be protected by Letters Patent of the United States is:

1. A method for forming a memory capacitor comprising:
  (i) depositing a platinum group metal on a barrier layer formed over a substrate to form a lower electrode of said memory capacitor comprising:
    introducing said substrate into a CVD deposition chamber;
    introducing an organic platinum based metal precursor to said CVD deposition chamber and irradiating said organic precursor with ultraviolet light in said CVD deposition chamber at a predetermined temperature and pressure for a predetermined time to decompose said organic precursor and form a platinum group metal film on said barrier layer; and
    annealing said substrate in an oxygen atmosphere at low temperature; and
  (ii) forming a dielectric layer over said lower electrode;
  (iii) forming an electrode over said dielectric layer.

2. The method according to claim 1, wherein said platinum metal group is deposited by forming an organic platinum metal group precursor on said substrate then subsequently irradiating said precursor with said ultraviolet light to form a platinum metal group film over said substrate.

3. The method according to claim 1, wherein said platinum metal group is simultaneously deposited by introducing said organic platinum metal group precursor in the presence of said ultraviolet light to form a platinum metal group film over said substrate.

4. The method according to claim 1, wherein said organic platinum based metal precursor is selected from the group consisting of cyclopentadienyl trimethylplatinum (IV) and methylcyclopentadienyl trimethylplatinum $CH_3(C_5H_5)Pt(CH_3)_3$.

5. The method according to claim 1, wherein said organic platinum based metal precursor is methylcyclopentadienyl trimethylplatinum $CH_3(C_5H_5)Pt(CH_3)_3$.

6. The method according to claim 1, wherein said predetermined temperature is from about −100° C. to about 200° C.

7. The method according to claim 6, wherein said predetermined temperature is from about 20° C. to about 150° C.

8. The method according to claim 7, wherein said predetermined temperature is about 25° C.

9. The method according to claim 1, wherein said predetermined pressure is from about 0.1 to about 1000 Torr.

10. The method according to claim 9, wherein said predetermined pressure is from about 1 to about 10 Torr.

11. The method according to claim 1, wherein said barrier layer is formed of TiN, TaN, WN or TiAlN.

12. The method according to claim 11, wherein said barrier layer is TiN.

13. The method according to claim 1, wherein said low temperature is from about 150° C. to about 400° C.

14. The method according to claim 13, wherein said low temperature is from about 200° C. to about 300° C.

15. The method according to claim 14, wherein said low temperature is about 250° C.

* * * * *